United States Patent [19]
Sellers

[11] Patent Number: 5,717,293
[45] Date of Patent: Feb. 10, 1998

[54] STRIKE ENHANCEMENT CIRCUIT FOR A PLASMA GENERATOR

[75] Inventor: Jeff C. Sellers, Palmyra, N.Y.

[73] Assignee: ENI Technologies, Inc., Rochester, N.Y.

[21] Appl. No.: 803,776

[22] Filed: Feb. 24, 1997

Related U.S. Application Data

[63] Continuation of Ser. No. 546,119, Oct. 20, 1995, abandoned.

[51] Int. Cl.⁶ ............................................. H01J 7/24
[52] U.S. Cl. ................ 315/111.21; 315/205; 315/176
[58] Field of Search ........................... 315/111.21, 176, 315/209 R, 205; 363/59, 61

[56] References Cited

U.S. PATENT DOCUMENTS

| | | | |
|---|---|---|---|
| 3,902,108 | 8/1975 | Sion | 321/15 |
| 3,909,666 | 9/1975 | Tenen | 315/209 R |
| 4,812,712 | 3/1989 | Ohnishi et al. | 315/111.21 |
| 5,057,988 | 10/1991 | Theroux et al. | 363/59 |
| 5,231,564 | 7/1993 | Pellegrino et al. | 363/61 |

FOREIGN PATENT DOCUMENTS

| | | | |
|---|---|---|---|
| 231918 | 1/1996 | Germany | 315/111.21 |
| 603579 | 6/1958 | United Kingdom . | |
| 1408822 | 10/1975 | United Kingdom . | |
| 1425506 | 2/1976 | United Kingdom . | |
| 1564401 | 4/1980 | United Kingdom . | |

*Primary Examiner*—Robert Pascal
*Assistant Examiner*—Michael Shingleton
*Attorney, Agent, or Firm*—Trapani & Molldrem

[57] ABSTRACT

A strike enhancement circuit for a dc power supply, which can be a switched half-bridge supply, creates a high voltage at high impedance to initiate a plasma in a plasma chamber or sputtering chamber. The strike circuit has a plurality of diode bridges that act as full-wave rectifiers or peak detectors. The transformer secondary of the power supply is connected through isolation capacitors to the ac inputs of each of the diode bridges. The dc ports of the diode bridges are stacked in series, and the combined, stacked voltage is applied across the input terminals of the plasma chamber. Each diode bridge also has a storage capacitor connected between the positive and negative dc ports. Positive and negative voltage peaks from the transformer secondary waveform are stored in the storage capacitors. The combined dc outputs applied to the plasma chamber appear as a voltage high enough to initiate a plasma discharge. Once the plasma is present, the impedance of the isolation capacitors prevents the strike circuit from providing the high strike voltage.

11 Claims, 2 Drawing Sheets

STRIKE ENHANCEMENT CIRCUIT FOR A PLASMA GENERATOR

This is a continuation of my earlier application Ser. No. 08/546,119, filed Oct. 20, 1995, now abandoned.

BACKGROUND OF THE INVENTION

This invention relates to power supplies for sputtering or plasma applications, and is more particularly directed to a strike circuit that applies a high strike voltage to the cathode and anode of a plasma chamber to initiate discharge between the electrodes. The invention is more particularly concerned with a strike circuit that can be added to an existing sputtering power supply without interfering with its operation and without requiring installation of control circuitry.

Sputtering is a vacuum deposition process in which a sputtering target is bombarded with ions, typically an ionized noble gas, and the atoms of the target material are mechanically freed by momentum transfer. The target material then coats a nearby substrate. The target material can be a metal, e.g., aluminum or nickel. In a reactive sputtering process, a reactive gas is introduced into the deposition chamber, and the freed target material reacts with the reactive gas to form a coating material. The coating material can be an oxide, e.g., $Al_2O_3$, carbide, e.g., SiC, or nitride, e.g., TiN. The sputtering process takes place in a plasma chamber, where the noble gas is present at very low, near-vacuum pressures. In order to accelerate the noble gas atoms towards the target, a plasma is generated. The plasma is a broad electrical discharge in which the noble gas ions of the plasma are accelerated towards the target, which serves as cathode. The voltage across the plasma is typically between about 300 volts and 700 volts, depending on the target material and the plasma chamber dimensions. However, to induce the plasma, a starting voltage, or strike voltage of several times the plasma operating voltage has to be present initially.

It is well known in this art to employ the intrinsic overshoot in the power stage of a power supply to generate the strike voltage. The prior art approach for producing the strike voltage requires leaving control of intrinsic and parasitic overshoots very loose, or a resonant power stage is used to boost or "Q-up" the voltage to strike the plasma. The prior art approach also requires additional parts, and produces additional losses in the power supply. This normally involves building the power supply with an undesirable turns ratio in the power supply transformer. It is also possible to provide a separate power supply for ignition of the plasma. However, in that case the separate ignition power supply would require separate controls, and would require revising the prime power supply so as to maintain at least 10 mm separation for electrical safety purposes.

OBJECTS AND SUMMARY OF THE INVENTION

It is an object of the present invention to provide a plasma strike circuit of simple, straightforward design, and which avoids the drawbacks of the prior art.

It is another object to provide a strike circuit that can be incorporated into an existing plasma generator or sputtering power supply, or which can be added on to an existing power supply.

It is a further object of the invention to provide the strike circuit to operate from the secondary winding of a prime power supply transformer and thus to avoid electrical safety problems.

It is a yet further object to provide a strike circuit with a high impedance that is operative to provide the high voltage to ignite the plasma at the onset of operations, but which ceases to supply high voltage automatically once the plasma is lit.

According to an aspect of the present invention, a strike circuit for a plasma generator has input leads coupled to transformer secondary leads of the plasma generator transformer, where a non-sinusoidal ac voltage waveform is provided. In plasma generators or power supplies of this type a stepped wave, e.g. a square wave, is applied to the primary winding, and so the secondary winding or windings will produce a somewhat irregular waveform, i.e., with large spikes or overshoots at the leading and trailing edges of the primary winding pulses. The strike circuit is formed of a stack of peak detecting circuits, each of which has first and second ac ports to which the ac waveform is applied, and positive and negative dc outputs at which appear the peak positive and negative voltages of the ac waveform. There are respective isolation capacitors interposed between the first input lead and one of the ac ports of the peak detecting circuits, and there are also respective isolation capacitors interposed between the second input lead and the other of the ac ports of the peak detecting circuits. In a preferred embodiment, the peak detecting circuits are each formed of a diode bridge and a capacitor coupled between the positive and negative dc ports.

The several peak detecting circuits have their dc output ports connected in series such that the positive output terminal of a first one of the peak detecting circuits is connected to a first high voltage output and the negative output terminal of the last of the peak detecting circuits is connected to a second high voltage output. The remaining positive and negative output terminals are connected with the negative terminal of each connected to the positive output terminal of the next peak detecting circuit in sequence. In this fashion, the high voltage outputs deliver a voltage level that is several times the peak-to-peak voltage of the input ac waveform. The first and second high voltage outputs are connected to the positive and negative outputs of the prime power supply, and thence to the anode and cathode of the associated plasma chamber.

In one practical embodiment, there are four diode bridges, i.e., four full wave rectifiers, connected as a stack, to produce a strike voltage of over a thousand volts when the voltage at the transformer secondary is only about three hundred volts.

The isolation capacitors appear in series with each other and with the respective diode bridge. As long as there is no appreciable load at the dc outputs of the diode bridges, i.e., when no plasma is present, the strike circuit is operative to place a high voltage across the anode and cathode of the plasma chamber. Then, once ionization begins, and the plasma is lit, the impedance between the anode and cathode drops to a value on the order of tens to hundreds of ohms. This value is small relative to the capacitive reactance $X_C$ of the isolation capacitors. Thus, during plasma operation, only a small fraction of the secondary peak-to-peak voltage appears across the respective peak detector circuits, and the strike circuit ceases to provide the high voltage level.

With the strike circuit in place, the power supply can automatically generate a plasma in a low-pressure plasma chamber, by providing to the input electrodes of the plasma chamber a strike voltage (e.g., 1,200 to 3000 volts dc) that is well in excess of the operating plasma voltage. Then, upon the generation of plasma in the chamber, the strike circuit automatically reduces the applied voltage to the plasma operating voltage (e.g., 300 to 700 volts dc). The secondary winding of the prime transformer produces a non-sinusoidal waveform that exhibits positive and negative peaks. This non-sinusoidal waveform is supplied through the isolation capacitors to the ac inputs of the plurality N of peak detector circuits, and each peak detector circuit produces a rectified dc voltage. The N rectified dc voltages are added together to make a high voltage that is applied to the plasma electrodes as the strike voltage. However, the strike voltage is produced at a high impedance, so that the strike voltage is operative under start-up conditions (no plasma) to initiate discharge in the noble gas and generate the plasma. Once the plasma is struck, the applied voltage is dominated by the prime supply operating voltage, and the high voltage is no longer present. If for some reason the plasma is interrupted the strike voltage will automatically come on when needed to re-ignite the plasma discharge.

The strike circuit of this invention is an inductionless step up circuit, and all the necessary components can be placed on a small auxiliary circuit board. Because the diode bridges operate only under very high impedance conditions, there is very little current flow and overheating is not a problem. This strike circuit lends itself both to incorporation into new sputtering power supplies and plasma generators, and also to retrofitting into existing power supplies.

The above and many other objects, features, and advantages of this invention will become apparent from the ensuing description of a preferred embodiment, which should be read in conjunction with the accompanying Drawing.

DETAILED DESCRIPTION OF THE PREFERRED EMBODIMENT

Figure 1:
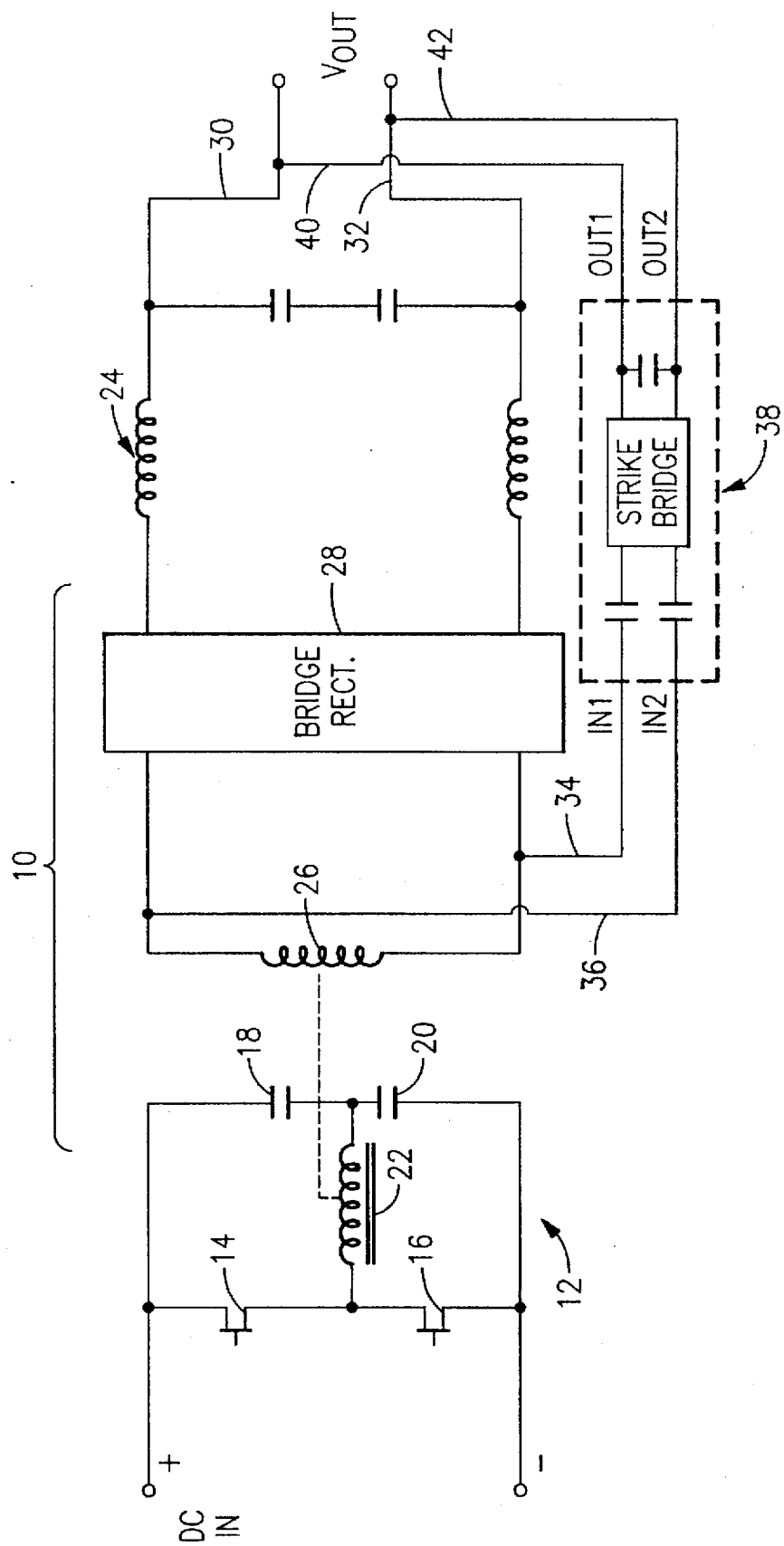
FIG. 1 is a circuit diagram of a power supply that incorporates the strike circuit according to one embodiment of this invention.

With reference to the Drawing, FIG. 1 shows the basic circuitry for a plasma or sputtering power supply 10. In this embodiment, the power supply has a half-bridge 12, which includes a pair of switching transistors 14, 16 in series between positive and negative DC power input lines, and a pair of capacitors 18 and 20 also connected in series between the DC power input lines. A primary winding 22 of a prime power transformer is coupled between a junction of the switching transistors 14, 16 and a junction of the capacitors 18, 20. A control circuit for gating the switching transistors 14 and 16 on and off is not shown here. An output side 24 of the power supply 10 includes a secondary winding 26 of the prime transformer, with leads coupled to ac inputs of a full-wave diode bridge or rectifier 28. The rectifier 28 has dc outputs that provide rectified dc voltage that is smoothed and supplied to positive and negative output terminals 30 and 32. These output terminals 30 and 32 connect to the anode and cathode (i.e., the target) of the plasma generator.

Figure 2:
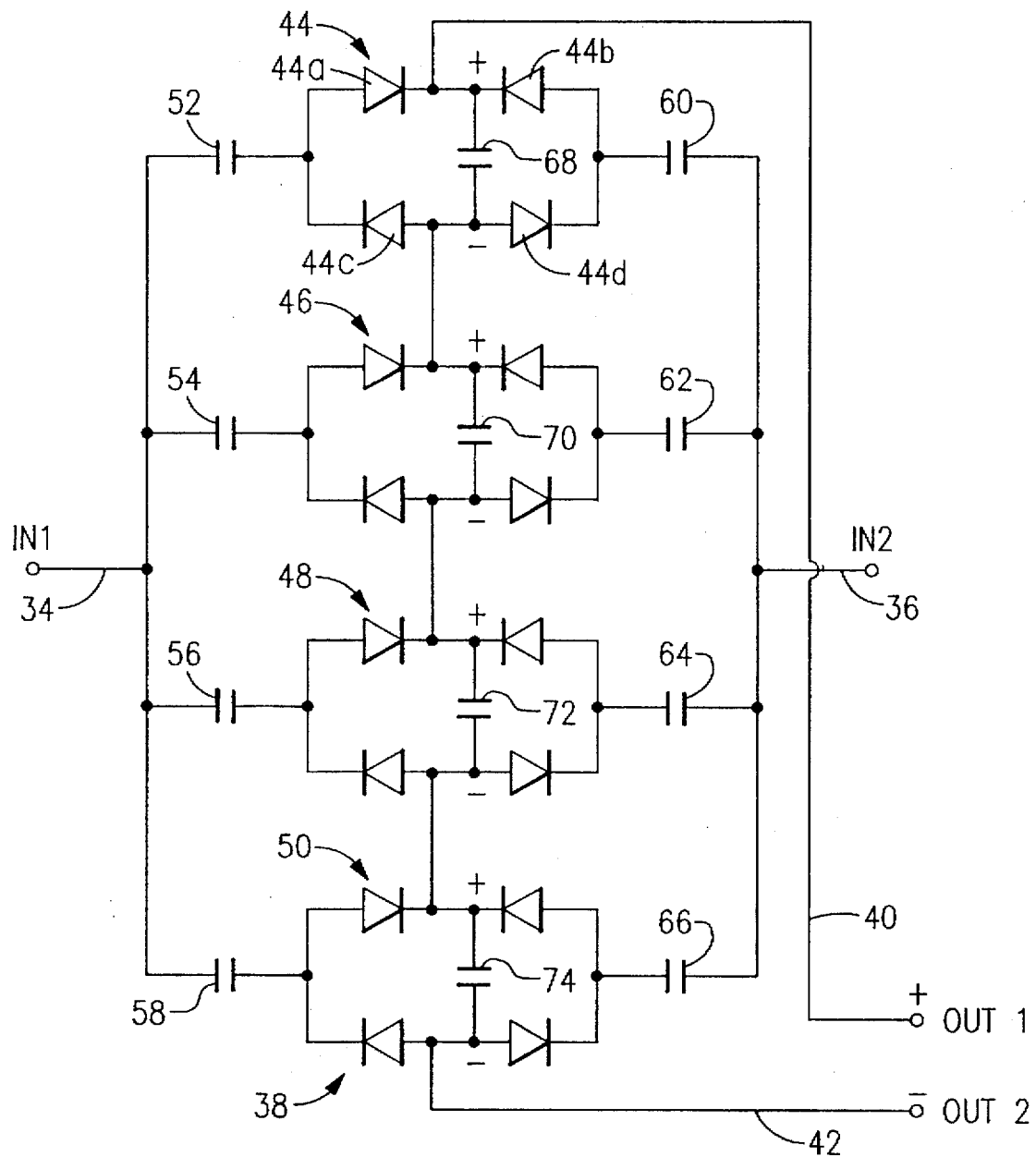
FIG. 2 is a circuit diagram showing details of the strike circuit of this embodiment.

A strike circuit that generates a high voltage for initiating a plasma has first and second input leads 34 and 36 that are coupled to the leads of the secondary winding 26, and these lead to inputs IN1 and IN2 of a strike bridge stage 38, which is illustrated in detail in FIG. 2. The strike bridge stage 28 produces a high voltage at high impedance, which appears at first and second outputs OUT1 and OUT2, and which are tied by high voltage leads 40 and 42 to the main output terminals 30 and 32.

As illustrated in FIG. 2, the strike bridge stage 38 is formed of a plurality of full-wave rectifier diode bridges, and in this embodiment there are four diode bridges 44, 46, 48 and 50. A first of these diode bridges 44 comprises diodes 44a, 44b, 44c, and 44c which are connected to define a pair of ac input ports or junctions, and p pair of dc output ports or junctions, here indicated as + and −. The remaining bridges 46, 48, 50 are similarly configured. The positive dc output port + of the bridge 44 is connected to OUT1, i.e., to high voltage output 40, and the negative dc output port − of the last bridge 50 is connected to OUT2, i.e., to high voltage output 42. There are also internal connections, with the negative port of bridge 44 coupled to the positive port of bridge 46, the negative port of bridge 46 coupled to the positive port of bridge 48, and the negative port of bridge 48 is coupled to the positive port of bridge 50.

For each of the diode bridges 44, 46, 48 and 50 there is a respective isolation capacitor 52, 54, 56, and 58 connecting one of the ac input ports to the input lead 34 from the transformer secondary 26. There are also respective isolation capacitors 60, 62, 64, and 66 connecting the other ac input ports of the bridges 44, 46, 48, 50 to the other input lead 36 from the secondary 26.

As also shown in FIG. 2, there is a storage capacitor 68 connected between the positive port + and the negative port − of the diode bridge 44, and there are like storage capacitors 70, 72, and 74 similarly connected in the bridges 46, 48, and 50, respectively.

In this embodiment, the switching transistors 14 and 16 are gated at a frequency on the order of fifty kilohertz to one megahertz. The current that passes back and forth through the primary winding 22 has a stepped waveform. In the secondary winding 26 this creates a voltage waveform with large overshoots at the positions of the leading and trailing edges of the primary waveform. The diode bridges 44, 46, 48, and 50 act as peak detectors, and pass the positive and negative voltage peaks to the respective storage capacitors 68, 70, 72, and 74. The isolation capacitors 52 to 58 and 60 to 66 provide these peak detection circuits with dc isolation from one another. The positive and negative dc outputs of the diode bridges 44, 46, 48 and 50 are stacked so that the stored peak voltages on the capacitors 68, 70, 72, and 74 add together. Thus with an ac input of a few hundred volts at the input leads 34 and 36, a high voltage output greater than 1000 volts appears across the output leads 40 and 42.

Current into the strike bridge stage 38 is limited by the isolation capacitors 52 to 66, that is, the impedance of the strike bridge stage is limited by the capacitive reactance $X_C$ of the isolation capacitors. In one practical embodiment, these have a capacitance value of 1000 pf. Current into the strike bridge stage is limited based on the current relation, $I=C\ dV/dt$. The value selected for the isolation capacitors depends also on the design pulse frequency for the power supply. Because the strike circuitry is driven from the power supply itself, no additional control circuitry is needed to operate the strike bridge circuit. Further, because the strike module is driven from the transformer secondary 26, it is not a problem to set up the strike circuit on an auxiliary circuit board that maintains the required creepage and clearance, and there are no negative impacts on safety. The strike bridge circuitry accomplishes it objectives by applying the combined or stacked dc voltage as the strike voltage to the input electrodes of said plasma chamber. The strike bridge circuit operates at a high voltage but also at a high impedance, due to the large capacitive reactance $X_C$ of the isolation capacitors, such that the high strike voltage is operative only under start-up conditions to generate a plasma discharge. However, once plasma has been generated and is present, a relatively low impedance on the order of tens to hundreds of ohms appears between the anode and target of the sputtering chamber. At that time the high impedance strike voltage is dominated by the operating voltage from the main power supply.

For purposes of simplicity of the Drawing figures, only a single transformer secondary 26 is shown here for the power supply. In a practical power supply, there may be two isolated secondary windings feeding separate rectifier bridges, and whose dc outputs are added together. In that case, the strike bridge input leads 34 and 36 are connected to only one of the secondary windings, in the fashion that is shown here. The high voltage outputs are coupled to the combined rectifier output.

Because the strike bridge stage 38 is inductionless, and employs only capacitors and diodes, the entire strike bridge circuit can be mounted on a small auxiliary circuit board, which can fit within the cabinet or housing of the power supply. This permits the strike bridge circuitry to be retrofitted without difficulty onto an existing power supply. Of course, the strike circuit can easily be incorporated into the design for a new power supply as well.

While the invention has been described in detail with respect to one preferred embodiment, it is to be understood that that embodiment is offered as an example, and that many modifications and variations would present themselves to persons skilled in the art, without departure from the scope and spirit of the invention, as defined in the appended claims.

I claim:

1. In combination with a plasma generator having a transformer secondary which provides an ac waveform having positive and negative voltage peaks and dc supply means including inputs coupled to respective outputs of said transformer secondary and a pair of main dc outputs which provide a dc power to positive and negative terminals of a plasma chamber; a strike enhancement circuit comprising first and second input leads coupled to the respective outputs of said transformer secondary;

first and second high voltage outputs connected together with said main dc outputs to said positive and negative terminals, respectively, of the plasma chamber;

a plurality of N peak detecting circuit means each having first and second ac ports to which the ac waveform is applied and positive and negative dc outputs at which appear peak positive and negative voltages of said waveform, respectively;

a first plurality of N isolation capacitors disposed between said first input lead and one of the ac ports of said N peak detecting circuit means, said isolation capacitors each having one lead connected to said first input lead and a second lead connected respectively to the first input port of a respective one of said peak detecting circuits;

a second plurality of N isolation capacitors disposed between said second input lead and the other of the ac ports of said N peak detecting circuit means, said isolation capacitors each having one lead connected to said second input lead and a second lead connected respectively to the second input port of a respective one of said peak detecting circuits;

said N peak detecting circuit means having their dc output ports connected in series such that the positive output terminal of a first one of said peak detecting circuit means is connected to said first high voltage output, the negative output terminal of an Nth one of said peak detecting means is connected to the second high voltage output, and for the remaining positive and negative output terminals, the negative terminal is connected to the positive output terminal of the next peak detecting circuit means in sequence, such that said ac waveform is applied in parallel to each said detecting circuit and a high voltage output is derived from said peak detecting circuits in series.

2. The strike enhancement circuit according to claim 1 wherein said first and second isolation capacitors each have a capacitance on the order of three nanofarads.

3. The strike enhancement circuit according to claim 1 wherein said peak detecting circuit means each include a full wave rectifier and a capacitor connected between the positive and negative dc outputs thereof.

4. The strike enhancement circuit according to claim 1 wherein said first and second input leads are transformer secondary outputs.

5. The strike enhancement circuit according to claim 1 wherein said first and second high voltage outputs are connected to dc outputs of a dc power supply.

6. Method of striking a plasma in a low pressure plasma chamber that receives at input electrodes of said chamber dc electrical power from dc outputs of a dc plasma power supply for maintaining the plasma, by initially applying to said input electrodes of said chamber a strike voltage well in excess of an operating plasma voltage, and then upon generating of a plasma in said chamber automatically reducing the applied voltage to said operating voltage, comprising the steps of extracting from a stage of said plasma power supply an ac waveform that exhibits positive and negative peaks;

supplying said ac waveform in parallel through isolation capacitors to ac inputs of a plurality of peak detector circuits;

producing in each said peak detector circuit a rectified dc voltage;

combining together in series the respective rectified dc voltages from said peak detector circuits; and applying the combined dc voltages as said strike voltage to the input electrodes of said plasma chamber at a high voltage and a high impedance such that said strike voltage is operative under start-up conditions to generate a plasma discharge, but is dominated by said operating voltage once said plasma has been generated and is present.

7. The method of claim 6, wherein said ac waveform has a peak voltage on the order of a few hundred volts and said strike voltage is greater than 1000 volts.

8. The method of claim 6, wherein said ac waveform is applied directly to the input electrodes of said chamber to which said strike voltage is also applied under said start up conditions.

9. The strike enhancement circuit according to claim 1 wherein said ac waveform is a stepped waveform at a frequency between about 50 KHz and 1 MHz, the ac waveform having significant overshoots at leading and trailing edges thereof.

10. The method of claim 6, wherein said ac waveform is a stepped waveform at a frequency between about 50 KHz and 1 MHz, the ac waveform having significant overshoots at leading and trailing edges thereof.

11. The strike enhancement circuit according to claim 1 further comprising an auxiliary circuit board on which said plurality of peak detecting circuit means, said first N isolation capacitors, said second N isolation capacitors are mounted to form a modular strike bridge circuit that can be retrofitted onto an existing plasma generator.

\* \* \* \* \*